United States Patent
Bose et al.

(10) Patent No.: US 7,489,161 B1
(45) Date of Patent: Feb. 10, 2009

(54) METHOD FOR EXTENDING LIFETIME RELIABILITY OF DIGITAL LOGIC DEVICES THROUGH REMOVAL OF AGING MECHANISMS

(75) Inventors: Pradip Bose, Yorktown Heights, NY (US); Jeonghee Shin, Los Angeles, CA (US); Victor Zyuban, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/123,489

(22) Filed: May 20, 2008

Related U.S. Application Data

(63) Continuation of application No. 11/928,232, filed on Oct. 30, 2007, now Pat. No. 7,391,233.

(51) Int. Cl.
*H03K 17/16* (2006.01)
*G05F 3/02* (2006.01)
(52) U.S. Cl. ............................. 326/33; 326/34; 326/95; 326/98; 327/537; 327/534
(58) Field of Classification Search .................. 326/33, 326/34, 95, 98; 327/537, 534
See application file for complete search history.

(56) References Cited

U.S. PATENT DOCUMENTS 6,329,874 B1 * 12/2001 Ye et al. ...................... 327/544
7,145,383 B2 * 12/2006 Mizuno et al. ............... 327/546
7,262,631 B2    8/2007 Chong
7,271,615 B2    9/2007 Afghahi et al.

OTHER PUBLICATIONS

Chung-Hsien Hua et al.; "A Power Gating Structure with Concurrent Data Retention and Intermediate Modes in 100NM CMOS Technology;" 15th VLSI Design/CAD Symposium 2004.

* cited by examiner

*Primary Examiner*—Vibol Tan
(74) *Attorney, Agent, or Firm*—Cantor Colburn LLP; Lisa Yamonaco

(57) ABSTRACT

A method for extending lifetime reliability of CMOS circuitry includes coupling a first switching device between a logic high supply rail/logic low supply rail, and coupling a virtual supply rail to the CMOS circuitry. In a first mode of operation the first switching device supplies the full voltage value between the logic high supply rail and the logic low supply rail, and in a second mode of operation, the first switching device isolates the virtual supply rail from the logic high supply rail/logic low supply rail, thereby reducing the voltage supplied to the CMOS circuitry. A second switching device is coupled between the virtual supply rail and the logic low supply rail/logic high supply rail, wherein in a third mode of operation, the voltage on the virtual supply rail and the logic low supply rail/logic high supply rail is equalized.

5 Claims, 2 Drawing Sheets

METHOD FOR EXTENDING LIFETIME RELIABILITY OF DIGITAL LOGIC DEVICES THROUGH REMOVAL OF AGING MECHANISMS

CROSS-REFERENCE TO RELATED APPLICATIONS

This non-provisional U.S. Patent Application is a continuation of U.S. patent application Ser. No. 11/928,232, which was filed Oct. 30, 2007, now U.S. Pat. No. 7,391,233 and is assigned to the present assignee.

BACKGROUND

The present invention relates generally to improvements in lifetime reliability of semiconductor devices and, more particularly, to a method and apparatus for extending lifetime reliability of digital logic devices through selective removal of aging mechanisms.

Lifetime reliability has become one of the major concerns in microprocessor architectures implemented with deep submicron technologies. In particular, extreme scaling resulting in atomic-range dimensions, inter and intra-device variability, and escalating power densities have all contributed to this concern. At the device and circuit levels, many reliability models have been proposed and empirically validated by academia and industry. As such, the basic mechanisms of failures at a low level have been fairly well understood, and thus the models at that level have gained widespread acceptance. In particular, work lifetime reliability models for use with single-core architecture-level, cycle-accurate simulators have been introduced. Such models have focused on certain major failure mechanisms including, for example, electromigration (EM), negative bias temperature instability (NBTI), PBTI (positive bias temperature instability) and time dependent dielectric breakdown (TDDB).

With respect to improving lifetime reliability of semiconductor devices, existing efforts may be grouped into three general categories: sparing techniques, graceful degradation techniques, and voltage/frequency scaling techniques. In sparing techniques, spare resources are designed for one or more primary resources and deactivated at system deployment. When primary resources fail later during system lifetime, the spare resources are then activated and replace the failed resources in order to extend system lifetime. The sparing techniques cause less performance degradation due to failed resources. However, high area overhead of spare resources is a primary drawback of this approach.

In graceful degradation techniques, spare resources are not essential in order to extend system lifetime. Instead, when resource failing occurs, systems are reconfigured in such a way so as to isolate the failed resources from the systems and continue to be functional. As a result, graceful degradation techniques save overhead cost for spare resources, however system performance degrades throughout lifetime. Accordingly, graceful degradation techniques are limited to applications and business where the degradation of performance over time is acceptable, which unfortunately excludes most of the high-end computing.

Thirdly, voltage/frequency scaling techniques are often used for power and temperature reduction and are thus proposed for lifetime extension. The system lifetime is predicted based on applied workloads and the voltage/frequency of the systems is scaled with respect to lifetime prediction. While voltage/frequency scaling techniques enable aging of systems to be slowed down as needed, these techniques also result in performance degradation of the significant parts of the system or the entire systems. In addition, although reduced voltage/frequency diminishes the degree of stress conditions, these techniques are unable to actually remove stress conditions of aging mechanisms from semiconductor devices.

Still another existing technique, directed to reducing the leakage power during inactive intervals, is to use so-called "sleep" or "power down" modes in which, for logic devices configured from low-threshold transistors, high-threshold transistors serve as a footer or a header to cut leakage during the quiescence intervals. During a normal operation mode, the circuits achieve high performance, resulting from the use of low-threshold transistors. The headers and/or footers are activated so as to couple the circuits to $V_{dd}$ and/or ground (more generally logic high and low voltage supply rails). In contrast, during the sleep mode, the high threshold footer or header transistors are deactivated to cut off leakage paths, thereby reducing the leakage currents by orders of magnitude. This technique, also known as "power gating," has been successfully used in embedded devices, such as systems on a chip (SOC). However, although power gating diminishes current flow and electric field across semiconductor devices (which results in a certain degree of stress reduction and increase in the lifetime of devices), it is unable to completely eliminate such stress conditions and/or stimulate the recovery effects of aging mechanisms.

SUMMARY

The foregoing discussed drawbacks and deficiencies of the prior art are overcome or alleviated, in an exemplary embodiment, by a method for selectively extending lifetime reliability of digital logic devices, including configuring complementary metal oxide semiconductor (CMOS) circuitry between a logic high supply rail and a logic low supply rail; an coupling a first switching device between one of the logic high supply rail and the logic low supply rail and a virtual supply rail coupled to the CMOS circuitry, wherein, in a first mode of operation the first switching device is rendered conductive so as to supply the full voltage value between the logic high supply rail and the logic low supply rail to the CMOS circuitry, and wherein, in a second mode of operation, the first switching device is rendered nonconductive so as to isolate the virtual supply rail from the one of the logic high supply rail the logic low supply rail, thereby reducing the value of the voltage supplied to the CMOS circuitry to a value between the logic high supply rail and the logic low supply rail; and coupling a second switching device between the virtual supply rail and the other of the logic high supply rail and the logic low supply rail, wherein, in a third mode of operation, the second switching device is rendered conductive so as to equalize the voltage on the virtual supply rail and the other of the logic high supply rail and the logic low supply rail.

BRIEF DESCRIPTION OF THE DRAWINGS

Referring to the exemplary drawings wherein like elements are numbered alike in the several Figures.

DETAILED DESCRIPTION

Disclosed herein is a robust lifetime extension method that enables the aging of resources to be suspended by entering a special mode, referred to herein as a "wearout gating" mode. As described in more detail below, wearout gating is implemented in such a way as to remove stress conditions of aging mechanisms, such as electromigration, negative bias temperature instability (NBTI), PBTI (positive bias temperature instability), and time dependent dielectric breakdown (TDDB), from semiconductor devices composing the resources.

In the case of electromigration, stress conditions result from current flow generated during one of a logical one-to-zero and a logical zero-to-one value transition of metal lines. For NBTI, semiconductor devices (more specifically PFET devices) are under stress when the gate terminal is coupled to a logic low voltage and the corresponding source terminal is coupled to a logic high voltage. For PBTI, semiconductor devices (more specifically NFET devices) are under stress when the gate terminal is coupled to a logic high voltage and the corresponding source terminal is coupled to a logic low voltage. Similarly, for the TDDB aging mechanism, stress conditions result from having a gate coupled to a logic low voltage and a source coupled to a logic high voltage for PFET devices, and having a gate coupled to a logic high voltage and a source coupled to a logic low voltage for NFET devices.

Figure 1:
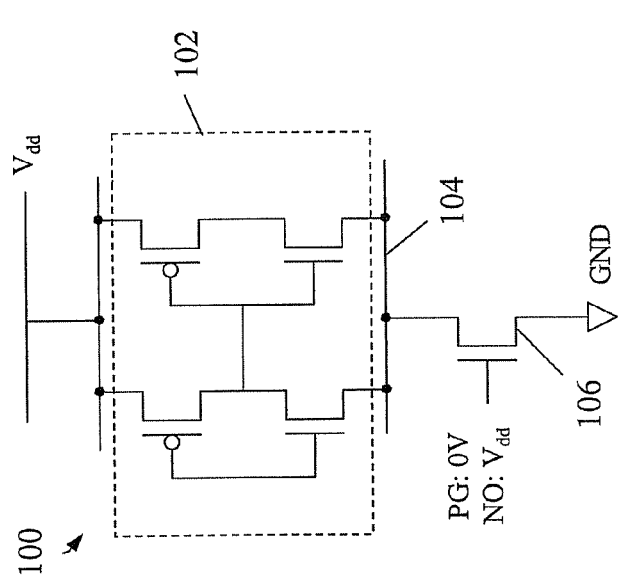
FIG. 1 is a schematic diagram of a footer version of a conventional power gating apparatus that is used in conjunction with CMOS circuitry.

Such stress conditions may be removed simply by isolating the $V_{dd}$ supply (logic high supply rail) or ground (logic low supply rail) from circuit devices. While $V_{dd}$ or GND isolation/disconnection has also been used in conventional power gating, such power gating circuitry is not effective in completely eliminating stress conditions, as its focus is leakage power reduction. By way of example, FIG. 1 is a schematic diagram of a conventional power gating apparatus 100 that is used in conjunction with CMOS circuitry 102. The circuitry 102, for ease of description, depicts a simple CMOS inverter pair. However, it will be understood that circuitry 102 can represent more complex devices, such as SRAM arrays, EDRAM arrays, register files, execution units, processor cores, processor chips and systems, and the like. In this example of power gating, the circuitry 102 is selectively connected between a virtual ground node 104 and ground through a footer (NFET) device 106.

In a normal operation (NO) mode, the virtual ground node 104 is at ground potential by activating the gate terminal of the NFET footer 106. Thus, the full value of the rail voltage is used by the circuitry 102. However, in the power gating (PG) mode, the virtual ground node 104 is isolated from ground by deactivating the gate of the NFET footer 106. Immediately after entering the power gating mode, the virtual ground is at the same potential as GND, and the circuit 102 still sees the full power swing between $V_{dd}$ and the virtual ground. As a result, the leakage current through the circuit 102 in the initial moments of power gating interval is the same as immediately before entering the power gating mode. The leakage through the footer device 106 in the initial moment of power gating interval is zero, because there is zero voltage between its source and drain. As a result, the difference between the leakage currents though the circuit 102 and the footer device 106 charges the virtual ground up, which leads to an increase in the leakage through the footer device, and reduction of the leakage through the logic. As the voltage at the virtual ground increases, the leakage though the logic is reduced, whereas the leakage through the footer device increases. When the leakage though the footer device becomes equal to the leakage though the logic, the voltage at the virtual ground reaches the steady state value. Eventually, this leakage stops and the voltage of the virtual ground node 104 stabilizes at some value between ground and $V_{dd}$ (e.g., from about ⅓ $V_{dd}$ to about ⅔ $V_{dd}$). As a result, the power gating circuitry reduces leakage power during this mode.

To a certain degree, the power gating apparatus 100 lessens stress conditions of wearout failure mechanisms. For example, current flow through metal lines and electric field across devices causing failure mechanisms such as NBTI and TDDB are significantly reduced in the power gating mode. On the other hand, the power gating apparatus 100 cannot completely remove the electric field across FET devices (i.e., force $V_{gs}=0$) due to voltage difference between the virtual ground node 104 and $V_{dd}$ (the amount of leakage). This in turn prevents implementation of any relief/recovery mechanisms with respect to stress conditions, such as NBTI for example.

Figure 2:
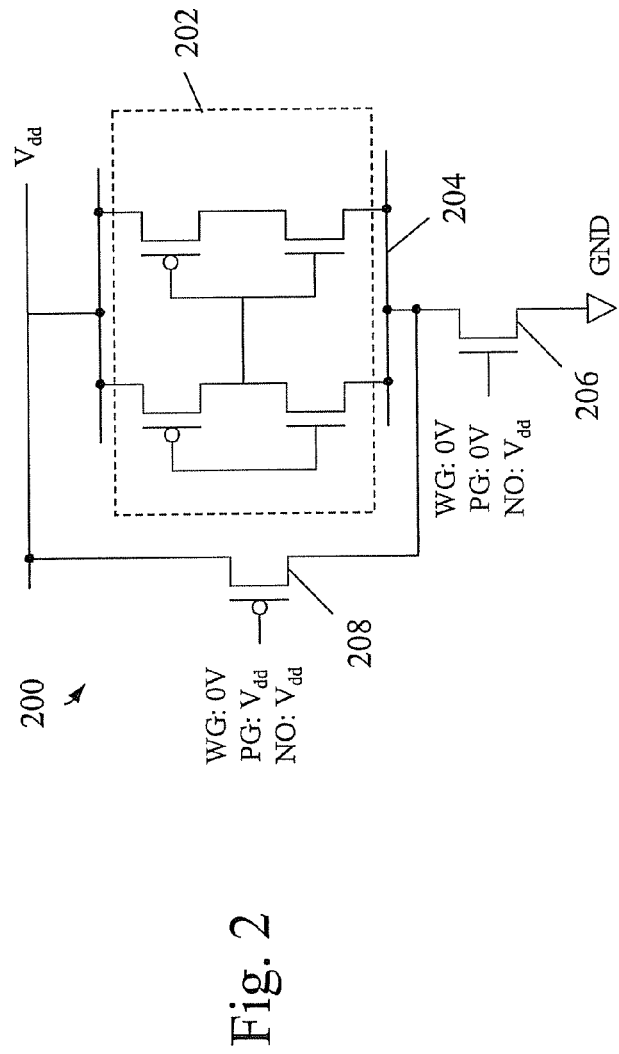
FIG. 2 is a schematic diagram of a footer version of an apparatus for suspending aging of circuit devices by implementing a wearout gating mode, in accordance with an exemplary embodiment of the invention.

Accordingly, FIG. 2 is a schematic diagram of an apparatus 200 for suspending aging of circuit devices by implementing a wearout gating mode, in accordance with an exemplary embodiment of the invention. In addition to providing current leakage (power gating) control for circuitry 202 through a footer device 206 coupled to virtual ground node 204, the apparatus 200 is also configured to selectively charge the virtual ground node 204 to $V_{dd}$ in order to completely remove the electric field across the devices of circuitry 202. Thus, as further shown in FIG. 2, the apparatus 200 additionally includes a PFET device 208 that, when activated, pulls up the virtual ground node 204 to $V_{dd}$. The source of the PFET device 208 is coupled to $V_{dd}$ while the drain of the PFET device 208 is coupled to the drain of the NFET footer 206.

In a normal mode of circuit operation (NO), the footer NFET 206 is conductive or activated, while the pull up PFET 208 is nonconductive, or deactivated. That is, the gate terminals of the both the footer NFET 206 and the PFET 208 are at logic high (e.g., $V_{dd}$). For the power gating (PG) mode for maximum current leakage protection as described above, both the footer NFET 206 and the PFET 208 are nonconductive. That is, the gate terminal of the footer NFET 206 is at logic low (e.g., 0 volts) and the gate terminal of the PFET 208 is at logic high.

However, in the wearout gating (WG) mode, the footer NFET 206 is deactivated while the PFET 208 is activated. That is, the gate terminals of both the footer NFET 206 and the PFET 208 are at logic low. As a result, the virtual ground node 204 is charged to $V_{dd}$ through the PFET 208, as it is isolated from ground. Thus, because the opposing power rail connections to the circuitry 202 are charged to the same voltage (e.g., $V_{dd}$), the electric field or stress conditions of wearout failure mechanisms across the circuit devices are removed.

It should be noted that although WG mode can also be used for power gating, it is not quite as effective as the conventional PG mode, due to the increase in leakage current through the NFET footer 206 (since the full rail voltage is now applied across the deactivated NFET footer 206 in the WG mode). For example, whereas power gating techniques can represent perhaps a 10-fold reduction in leakage current with respect to devices with no footer (or header) protection, the wearout gating technique can still provide about half the leakage reduction benefits (e.g., about a 5-fold reduction in leakage current).

Another reason why the WG mode is not quite as effective for leakage reduction as the PG mode is that with WG it takes more time to bring the circuit to the normal operation mode. The reason is that the capacitance at virtual ground (C_vg) and at the nodes of the circuit (C_circuit) that are supposed to be at zero during the normal operation mode needs to be discharged from the $V_{dd}$ level to ground, requiring the footer to pass the total electric charge of (C_circuit+C_vg)*Vdd from virtual ground to GND. To return to the circuit to the normal operation from the PG mode, the footer needs to pass the total charge of (C_circuit+C_vg)*V_vg, where V_vg is much smaller than $V_{dd}$.

Finally, the WG mode does not allow any state retention, since all nodes in the circuit during the WG mode are charged to the same voltage, and therefore cannot have any "memory" of the state prior to entering the WG mode.

Figure 3:
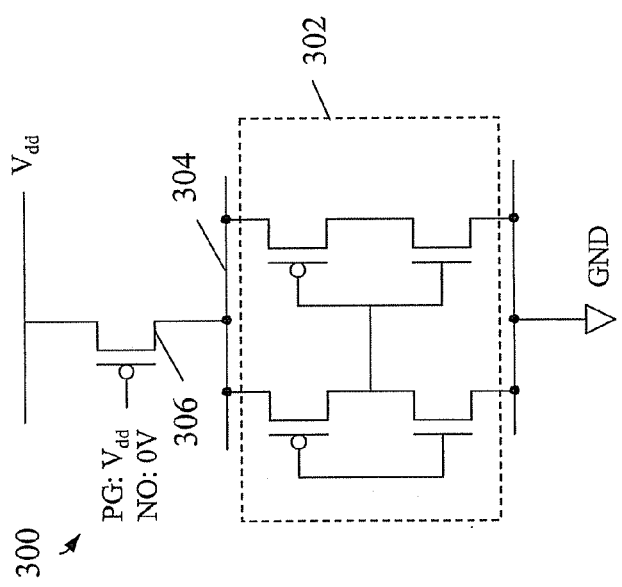
FIG. 3 is a schematic diagram of a header version of a conventional power gating apparatus that is used in conjunction with CMOS circuitry.

It will further be appreciated that the principles of wearout gating are also applicable to header devices as well, in addition to the NFET footer example of FIG. 2. Stated another way, the stress condition may be relieved from FET devices by equalizing the power rail connections thereto to a different voltage (e.g., ground). For example, FIG. 3 is a schematic diagram of another conventional power gating apparatus 300 that is used in conjunction with CMOS circuitry 302. Again, the circuitry 302, for ease of description, depicts a simple CMOS inverter pair. However, it will be understood that circuitry 302 can represent more complex devices, such as SRAM arrays, EDRAM arrays, register files, execution units, processor cores, processor chips and systems, and the like. In this example of power gating, the circuitry 302 is selectively connected between a virtual $V_{dd}$ node 304 and $V_{dd}$ through a header (PFET) device 306.

In a normal operation (NO) mode, the virtual $V_{dd}$ node 304 is at $V_{dd}$ potential by activating the gate terminal of the PFET header 306. Thus, the full value of the rail voltage is used by the circuitry 302. However, in the power gating (PG) mode, the virtual $V_{dd}$ node 304 is isolated from $V_{dd}$ by deactivating the gate of the PFET header 306. Immediately after entering the power gating mode, the virtual $V_{dd}$ is at the same potential as $V_{dd}$, and the circuitry 302 still sees the full power swing between ground and the virtual $V_{dd}$. As a result, the leakage current through the circuitry 302 in the initial moments of power gating interval is the same as immediately before entering the power gating mode. The leakage through the header device 306 in the initial moment of power gating interval is zero, because there is zero voltage between its source and drain. As a result, the difference between the leakage currents though the circuitry 302 and the header device 306 discharges the virtual $V_{dd}$, which leads to an increase in the leakage through the header device, and reduction of the leakage through the logic. As the voltage at the virtual $V_{dd}$ decreases, the leakage though the logic is reduced, whereas the leakage through the header device increases. When the leakage though the header device becomes equal to the leakage though the logic, the voltage at the virtual $V_{dd}$ reaches the steady state value. Eventually, this leakage stops and the voltage of the virtual $V_{dd}$ node 304 stabilizes at some value between ground and $V_{dd}$ (e.g., from about ⅓ $V_{dd}$ to about ⅔ $V_{dd}$). As a result, the power gating circuitry reduces leakage power during this mode.

Figure 4:
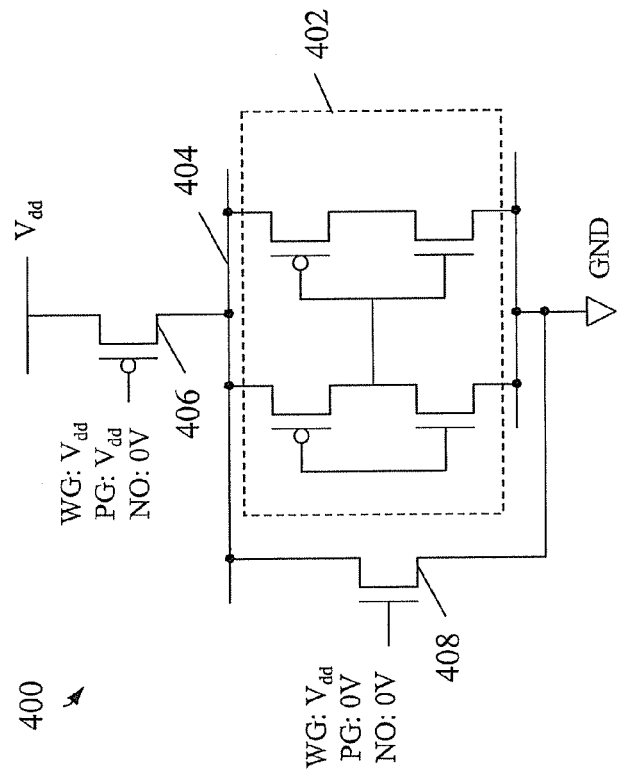
FIG. 4 is a schematic diagram of a header version of an apparatus for suspending aging of circuit devices by implementing a wearout gating mode, in accordance with another exemplary embodiment of the invention.

In contrast, FIG. 4 is a schematic diagram of an apparatus 400 for suspending aging of circuit devices by implementing a wearout gating mode, in accordance with an exemplary embodiment of the invention. In addition to providing current leakage (power gating) control for circuitry 402 through a header device 406 coupled to virtual $V_{dd}$ node 404, the apparatus 400 is also configured to selectively discharge the virtual $V_{dd}$ node 404 to ground in order to completely remove the electric field across the devices of circuitry 402. Thus, as further shown in FIG. 4, the apparatus 400 additionally includes an NFET device 408 that, when activated, pulls down the virtual $V_{dd}$ node 404 to ground. The source of the NFET device 408 is coupled to ground while the drain of the NFET device 408 is coupled to the drain of the PFET header 406.

In a normal mode of circuit operation (NO), the header PFET 406 is conductive or activated, while the pull down NFET 408 is nonconductive, or deactivated. That is, the gate terminals of the both the header PFET 406 and the NFET 408 are at logic low (e.g., 0 volts). For the power gating (PG) mode for maximum current leakage protection as described above, both the header PFET 406 and the NFET 408 are nonconductive. That is, the gate terminal of the header PFET 406 is at logic high (e.g., 0 $V_{dd}$) and the gate terminal of the NFET 408 is at logic low.

However, in the wearout gating (WG) mode, the header PFET 406 is deactivated while the NFET 408 is activated. That is, the gate terminals of both the header PFET 406 and the NFET 408 are at logic high. As a result, the virtual $V_{dd}$ node 404 is discharged to ground through the NFET 408, as it is isolated from $V_{dd}$. Thus, because the opposing power rail connections to the circuitry 202 are at the same voltage (e.g., ground), the electric field or stress conditions of wearout failure mechanisms across the circuit devices are removed.

Although though the footer and header devices in FIGS. 1 through 4 are shown as a single device, it should be noted that they could also be implemented through multiple devices, connected in parallel. In an exemplary layout, such footer and header devices may be mixed with the devices of the circuitry in a row-by row basis, a column-by-column basis or any other order, or by being located in a perimeter fashion around the main circuitry. Furthermore, the header and footer devices may also be implemented as multiple devices of different strengths (conductivity), with individual control of the each device gates so as to select a specific level of strength of the header/footer device. Moreover, this technique would also be applicable to pull up/pull down devices in FIGS. 2 and 4 used to charge/discharge the virtual rail in the WG mode.

As will thus be appreciated, the wearout gating techniques disclosed herein are proactive with respect to component failure, while most of existing approaches for lifetime extension thus far are reactive to component failures. Wearout gating therefore has at least the following main advantages over reactive approaches:

1) Removing stress conditions in wearout gating mode results in not only suspending wearout but also significantly recovering from wearout, especially due to the NBTI aging mechanism. In other words, wearout gating mode accelerates the recovery effect, further extending lifetime; 2) Resource failings generally introduce performance degradation due to reduced computing power or additional latency to access spare resources replacing the failed ones. The wearout gating mode enables resources to be spared, especially for transactions along critical paths, thus alleviating such performance degradation.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for selectively extending lifetime reliability of digital logic devices, the method comprising:
   configuring a complementary metal oxide semiconductor (CMOS) circuitry between a logic high supply rail and a logic low supply rail;
   coupling a first switching device between one of the logic high supply rail and the logic low supply rail and a virtual supply rail coupled to the CMOS circuitry, wherein, in a first mode of operation the first switching device is rendered conductive so as to supply the full voltage value between the logic high supply rail and the logic low supply rail to the CMOS circuitry, and wherein, in a second mode of operation, the first switching device is rendered nonconductive so as to isolate the virtual supply rail from the one of the logic high supply rail the logic low supply rail, thereby reducing the value of the voltage supplied to the CMOS circuitry to a value between the logic high supply rail and the logic low supply rail; and
   coupling a second switching device between the virtual supply rail and the other of the logic high supply rail and the logic low supply rail, wherein, in a third mode of operation, the second switching device is rendered conductive so as to equalize the voltage on the virtual supply rail and the other of the logic high supply rail and the logic low supply rail.

2. The method of claim 1, wherein in the third mode of operation, the first switching device is rendered nonconductive.

3. The method of claim 2, wherein in the first and second modes of operation, the second switching device is rendered nonconductive.

4. The method of claim 1, wherein:
   the first switching device comprises an NFET footer coupled between a virtual ground node and ground such that in the first mode of operation the NFET footer couples the virtual ground node to ground, and in the second mode of operation, the NFET footer isolates the virtual ground node from ground; and
   the second switching device comprises a pull up PFET coupled between the virtual ground and the logic high supply rail, $V_{dd}$, wherein, in the third mode of operation, the pull up PFET charges the virtual ground node to $V_{dd}$.

5. The method of claim 1, wherein:
   the first switching device comprises a PFET header coupled between a virtual $V_{dd}$ (logic high) node and $V_{dd}$ such that in the first mode of operation the PFET header couples the virtual $V_{dd}$ node to $V_{dd}$, and in the second mode of operation, the PFET header isolates the virtual $V_{dd}$ node from $V_{dd}$; and
   the second switching device comprises a pull down NFET coupled between the virtual $V_{dd}$ and ground, wherein, in the third mode of operation, the pull down NFET discharges the virtual $V_{dd}$ node to ground.

* * * * *